US010972107B2

(12) United States Patent
Han et al.

(10) Patent No.: US 10,972,107 B2
(45) Date of Patent: Apr. 6, 2021

(54) SERIAL DATA RECEIVER WITH SAMPLING CLOCK SKEW COMPENSATION

(71) Applicant: Apple Inc., Cupertino, CA (US)

(72) Inventors: Jaeduk Han, Albany, CA (US); Wenbo Liu, Cupertino, CA (US); Wing Liu, Milpitas, CA (US); Ming-Shuan Chen, Santa Clara, CA (US); Sanjeev K. Maheshwari, Fremont, CA (US); Vishal Varma, Fremont, CA (US); Sunil Bhosekar, Austin, TX (US); Lizhi Zhong, Sunnyvale, CA (US); Gary A. Rogan, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/528,518

(22) Filed: Jul. 31, 2019

(65) Prior Publication Data
US 2021/0036707 A1  Feb. 4, 2021

(51) Int. Cl.
*H03L 7/08* (2006.01)
*H03L 7/081* (2006.01)

(52) U.S. Cl.
CPC .......... *H03L 7/0818* (2013.01); *H03L 7/0807* (2013.01); *H03L 2207/12* (2013.01)

(58) Field of Classification Search
CPC .. H03L 7/0818; H03L 7/0807; H03L 2207/12
See application file for complete search history.

(56) References Cited

U.S. PATENT DOCUMENTS

| 3,737,778 | A  | * | 6/1973 | Van Gerwen ....... H04L 27/0008 375/316 |
| 7,325,175 | B2 | * | 1/2008 | Momtaz .............. H03M 1/1245 714/704 |
| 7,339,989 | B1 | * | 3/2008 | McAdam .......... H04L 25/03057 375/232 |
| 8,243,782 | B2 | * | 8/2012 | Mobin .............. H04L 25/03343 375/232 |
| 9,906,231 | B2 | * | 2/2018 | Kang ........................ H03L 7/10 |
| 10,574,487 | B1 | * | 2/2020 | Hormati ............ H04L 25/03076 |

* cited by examiner

*Primary Examiner* — Dinh T Le
(74) *Attorney, Agent, or Firm* — Kowert, Hood, Munyon, Rankin & Goetzel, P.C.

(57) ABSTRACT

An apparatus includes a receiver buffer, a phase compensation circuit, a data sampler circuit, and an error sampler circuit. The receiver buffer may generate an equalized signal on a signal node using an input signal received via a channel. The phase compensation circuit may, in response to an initiation of a training mode, replace the equalized signal on the signal node with a reference signal. The data sampler circuit may sample, using a data clock signal, the reference signal to generate a plurality of data samples. The error sampler circuit may sample, using an error clock signal, the reference signal to generate a plurality of errors samples. The phase compensation circuit may also adjust a phase difference between the data clock signal and the error clock signal using at least some of the plurality of data samples and at least some of the plurality of error samples.

20 Claims, 9 Drawing Sheets

SERIAL DATA RECEIVER WITH SAMPLING CLOCK SKEW COMPENSATION

BACKGROUND

Technical Field

Embodiments described herein are related to the field of integrated circuits, and more particularly to high-speed wireline communication in an integrated circuit.

Description of the Related Art

A computer system or integrated circuit (IC), such as a system-on-a-chip (SoC), may include one or more types of communication interfaces for exchanging information between ICs, or between functional circuits within an IC. Various types of interfaces may include one or more channels for exchanging one or more bits of information. The speed for transmitting and receiving information (referred to herein as a "data rate," or a "bit rate") via a communication interface may impact the performance of an IC as well as of a computer system that includes the IC. Multiple communication channels may be used in a given communication interface to increase an overall data rate by sending multiple bits of information in parallel. Costs and size restrictions may, however, limit a number of channels available in the given communication interface. Additional increases in data rate may, therefore, utilize faster communication channels.

As data rates on a communication channel increase, a data window in which a value of a transmitted data bit is valid decrease. A decreased data window may increase a bit error rate when sampling the communication channel to receive the data bit. One method for decreasing bit error rates when sampling the communication channel includes sampling the communication channel to determine both a set of data values and a set of error values. The error values may be used to adjust characteristics of the receiver circuit when sampling the communication channel. These adjustments may compensate for various conditions in the communication channel and/or the receiver circuit that may otherwise increase the bit error rate.

SUMMARY OF THE EMBODIMENTS

Broadly speaking, a system, an apparatus, and a method are contemplated in which the apparatus includes a receiver buffer, a phase compensation circuit, a data sampler circuit, and an error sampler circuit. The receiver buffer may be configured to generate an equalized signal on a signal node using an input signal received via a channel. The phase compensation circuit may be configured to, in response to an initiation of a training mode, replace the equalized signal on the signal node with a reference signal. The data sampler circuit may be configured to sample, using a data clock signal, the reference signal to generate a plurality of data samples. The error sampler circuit may be configured to sample, using an error clock signal, the reference signal to generate a plurality of errors samples. The phase compensation circuit may further be configured to adjust a phase difference between the data clock signal and the error clock signal using at least some of the plurality of data samples and at least some of the plurality of error samples.

In a further example, the phase compensation circuit may be further configured to, in response to a number of data samples having been generated, replace the reference signal with a complement reference signal. The data sampler circuit may be further configured to sample, using the data clock signal, the complement reference signal to generate a plurality of complement data samples. The error sampler circuit may be further configured to sample, using the error clock signal, the complement reference signal to generate a plurality of complement errors samples. In one example, to adjust the phase difference between the data clock signal and the error clock signal, the phase compensation circuit may be further configured to adjust the phase difference using at least some of the plurality of complement data samples and at least some of the plurality of complement error samples.

In another example, to adjust the phase difference between the data clock signal and the error clock signal, the phase compensation circuit may be further configured to determine a data transition time indicative of when a transition of the reference signal is detected by the data sampler circuit, and to determine an error transition time indicative of when the same transition of the reference signal is detected by the error sampler circuit. The phase compensation circuit may be further configured to determine the phase difference using the data transition time and the error transition time.

In an embodiment, the apparatus may further comprise a data phase interpolator circuit configured to generate the data clock signal using a first clock signal and a first delay value. The apparatus may also comprise an error phase interpolator circuit configured to generate the error clock signal using a second clock signal and a second delay value.

In one example, the phase compensation circuit may also be configured to set the first delay value and the second delay value to respective initial values, and to collect an initial one of the plurality of data samples and an initial one of the plurality of error samples. In a further example, the phase compensation circuit may be further configured to collect subsequent ones of the plurality of data samples and subsequent ones of the plurality of error samples by incrementing the first and second delay values in response to collecting at least a subsequent one of the plurality of data samples and at least a subsequent one of the plurality of error samples.

BRIEF DESCRIPTION OF THE DRAWINGS

The following detailed description makes reference to the accompanying drawings, which are now briefly described.

Figure 1:
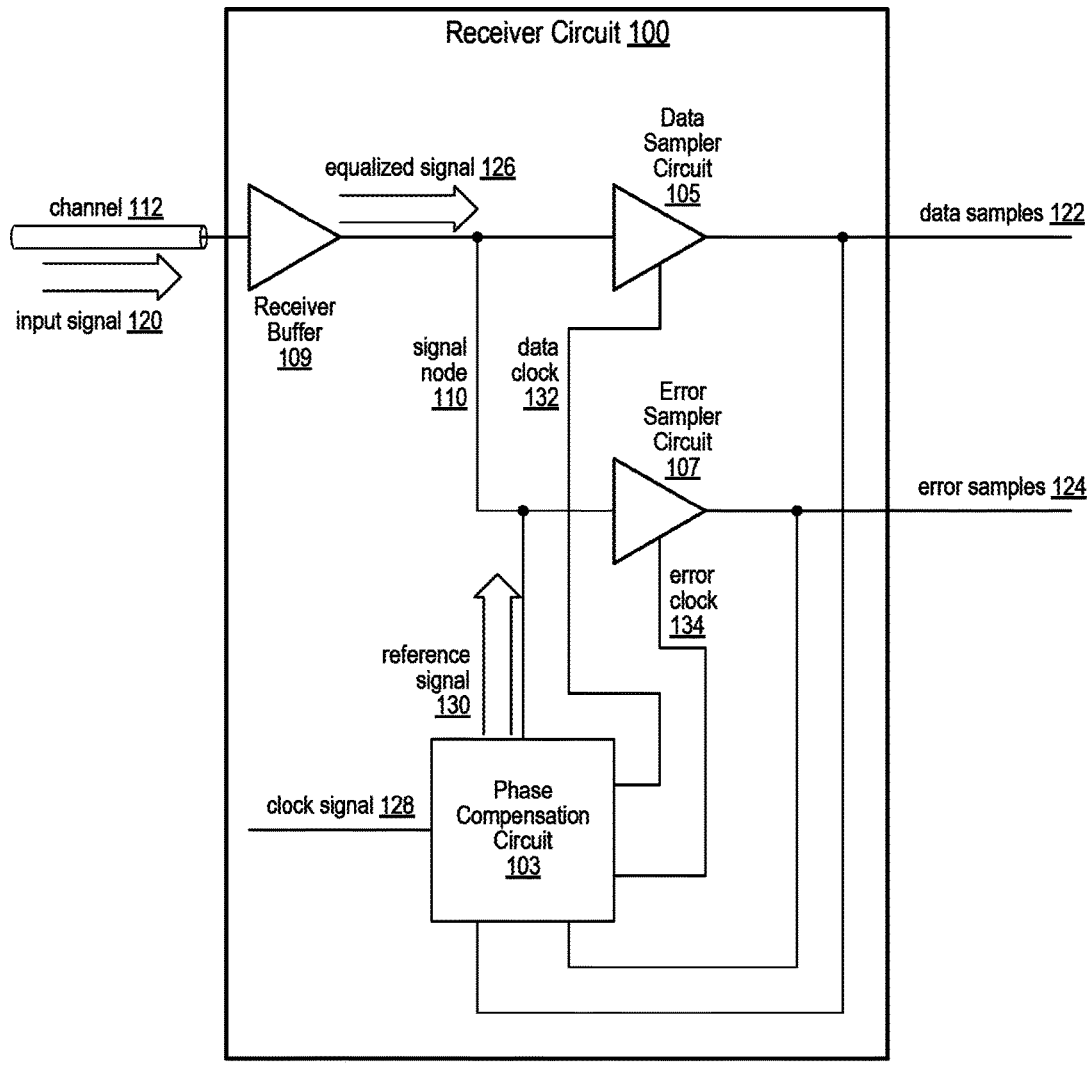
FIG. 1 illustrates a block diagram of an embodiment of a receiver system.
Figure 1:
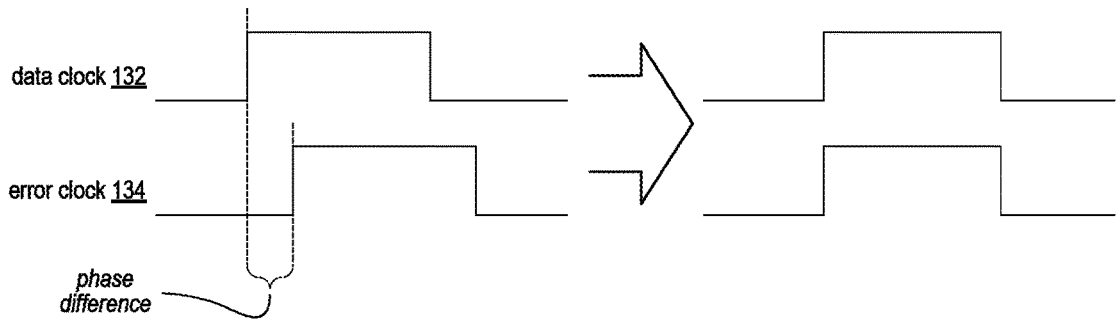

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

High-speed serial communication circuits may be utilized in an integrated circuit (IC) for a variety of interfaces, such as, Ethernet, universal serial bus (USB), serial AT attachment (SATA), and double-data rate (DDR) interfaces. Some designs may include multiple communication channels arranged in parallel to increase data transfer bandwidth by sending one or more bits of a data word (referred to herein as a data symbol) via each channel. Since each channel uses a transmitter circuit on one end to send data and a receiver circuit on the other end to receive the data, increasing the number of communication channels may increase costs and circuit size, thereby limiting a number of channels that may be utilized in particular embodiments.

Increasing data rates on each of the communication channels, therefore, is another option for data transfer bandwidth. Increasing data rates, however, may lead to increased bit error rates. Various characteristics of communication channels may contribute to bit errors, such as differences in impedance from channel to channel, signal reflections in the wires carrying the data signals, cross-talk or noise from adjacent circuits, and the like. In some embodiments, to compensate for these characteristics and reduce bit error rates, a decision feedback equalization (DFE) circuit is included in the receiver circuit. Some DFE circuits utilize error bits to help determine an amount of compensation to apply to a respective receiver circuit. These error bits are sampled at a same time as corresponding data bits are sampled. The data bits may be captured and presented to other circuits as the received data while the error bits are used by the DFE circuit to determine a particular compensation to apply to the received signal. The compensated signal may be sent to receiver buffer 109 to generate equalized signal 126. Misalignment between the sampling of a data bit and the sampling of its corresponding error bit may reduce an effectiveness of the DFE circuit and result in an increased bit error rate. A phase difference between a data clock signal used to sample the data bits and an error clock signal used to sample the error bits may, therefore, lead to increased bit error rate and reduced data transfer bandwidth.

Embodiments of apparatus and methods are presented for reducing a phase difference between a data clock signal and an error clock signal. One such embodiment may include a receiver circuit that replaces an equalized data input signal with a reference signal. Using a data clock signal, the reference signal is sampled to generate a plurality of data samples, and using an error clock signal, is sampled to generate a plurality of errors samples. A phase difference between the data clock signal and the error clock signal may then be adjusted using at least some of the plurality of data samples and the plurality of error samples. Use of such an apparatus may improve an effectiveness of a DFE circuit, thereby improving durations of received data windows. These improved data windows may be capable of supporting higher data transfer bandwidths with little or no increase in bit error rates.

A block diagram for an embodiment of a receiver circuit is illustrated in FIG. 1. Receiver circuit 100 may be included in an integrated circuit (IC) as part of a communication interface, for example, Ethernet, universal serial bus (USB), serial AT attachment (SATA), and double-data rate (DDR) memory interfaces. Receiver circuit 100 may, therefore, represent a receiver channel for one serial bitstream of a plurality of bitstreams that combined form a data word. In various embodiments, receiver circuit 100 may be used to communicate with an IC in another package, an IC on another die in a same package, or other circuits within a same IC. As illustrated, receiver circuit 100 includes phase compensation circuit 103, data sampler circuit 105, error sampler circuit 107, and receiver buffer 109, all coupled to signal node 110. Receiver circuit 100 receives input signal 120 via channel 112, and generates two output signals, data samples 122 and error samples 124.

As illustrated, receiver buffer 109 is configured to generate equalized signal 126 using input signal 120, received via channel 112. Equalized signal 126 includes a plurality of data symbols, each data symbol representing one or more bits of information based on a voltage level. Equalized signal 126 is sent to both data sampler circuit 105 and error sampler circuit 107. Data sampler circuit 105 generates data samples 122 by sampling equalized signal 126 at points in time that are determined by transitions of data clock signal 132. In a similar manner, error sampler circuit 107 samples equalized signal 126 to generate error samples 124 at points in time that are determined by transitions of error clock signal 134. In various embodiments, data sampler circuit 105 and error sampler circuit 107 may be implemented as a same type of circuit or may have some different circuit designs to perform their respective sampling tasks. For example, both data sampler circuit 105 and error sampler circuit 107 may be implemented as respective flip-flop circuits. In response to an active clock transition (e.g., on data clock signal 132 or error clock signal 134), the flip-flop circuit latches a logic high or a logic low data value based on a comparison of the voltage level of equalized signal 126 to a threshold voltage of the respective sampler circuits. In various embodiments, error sampler circuit 107 may or may not have a different threshold voltage than data sampler circuit 105.

Data samples 122 may be used to determine data values received via channel 112. Error samples 124 may be used by a DFE circuit (not shown) to compensate for characteristics of channel 112 that may cause bit errors, thereby reducing a bit error rate of data samples 122. For example, Data sampler circuit 105 may sample equalized signal 126 using a first threshold voltage level to distinguish between logic high data and logic low data encoded on equalized signal 126. The resulting data samples 122 may then be sent to other circuits as received data. Error sampler circuit 107 may sample equalized signal 126 using a second threshold voltage level, different than the first threshold voltage level used by the data sampler circuit 105. The resulting error samples 124 may provide an indication of a voltage level of equalized signal 126 at each sampling time. For example, if a particular data sample and a particular error sample, each taken at a same sample time, have different logic values, then equalized signal 126 may have been in transition at the sample time or may be in need of additional compensation to overcome current conditions on channel 112.

In the example embodiment, a lowest bit error rate may be achieved when there is no phase difference between data clock signal 132 and error clock signal 134 and transitions of both clock signals occur at the same points in time, thereby aligning each one of data samples 122 to a corresponding one of error samples 124. Due to various anomalies, such as manufacturing inconsistencies, noise generated by nearby circuits, operating conditions, and the like, transitions of data clock signal 132 and error clock signal 134 may be separated by a particular amount of time. This particular amount of time is referred to herein as a "phase difference" between data clock signal 132 and error clock signal 134.

To reduce a phase difference between data clock signal 132 and error clock signal 134, receiver circuit 100 may switch from the standard operating mode to a training mode. In a training mode, known data may be provided to sampler circuits, which may then sample the known data at various points in time to determine if the data sampler circuit and error sampler circuit detect transitions of the known data input at a point different time. Phase compensation circuit 103, as shown, is configured to, in response to an initiation of the training mode, replace equalized signal 126 on signal node 110 with reference signal 130. For example, receiver buffer 109, in response to the initiation of training mode, may place its output in a high impedance state, while phase compensation circuit 103 switches out of a high impedance state on signal node 110 and instead generates reference signal 130 on signal node 110. Phase compensation circuit 103 generates reference signal 130 using clock signal 128. In some embodiments, phase compensation circuit 103 may also generate data clock signal 132 and error clock signal 134 using clock signal 128.

In the training mode, data sampler circuit 105 is configured to sample, using data clock signal 132, reference signal 130 to generate a plurality of data samples 122. Similarly, error sampler circuit 107 is configured to sample, using error clock signal 134, reference signal 130 to generate a plurality of errors samples 124. While reference signal 130 is being sampled, phase compensation circuit 103 may adjust timing of transitions on both data clock signal 132 and error clock signal 134, such as by sweeping a delay time on each clock signal starting with an initial delay time and progressing to a final delay time.

Both data samples 122 and error samples 124 are received by phase compensation circuit 103. Phase compensation circuit 103 is further configured to adjust a phase difference between data clock signal 132 and error clock signal 134 using at least some of the plurality of data samples 122 and at least some of the plurality of error samples 124. For example, phase compensation circuit 103 may determine at which sample data samples 122 changes value, thereby indicating a data transition time. In a similar manner, phase compensation circuit 103 may determine an error transition time based on which sample that error samples 124 changes value. By comparing the data transition time to the error transition time, a phase difference between data clock signal 132 and error clock signal 134 may be determined, allowing phase compensation circuit 103 to adjust a delay time on data clock signal 132 and/or error clock signal 134 to reduce the phase difference. By reducing the phase difference, error samples 124 may be generated at close to a same time as data samples 122, allowing a DFE circuit to determine accurate compensation for receiver circuit 100 to reduce a bit error rate on data samples 122.

It is noted that receiver system 100 as illustrated in FIG. 1 is merely an example. The illustration of FIG. 1 has been simplified to highlight features relevant to this disclosure. Various embodiments may include different configurations of the circuit blocks, including additional circuit blocks such as a DFE circuit and associated compensation circuits.

The receiver system illustrated in FIG. 1 is described as using a phase compensation circuit to reduce a phase difference between two clock signals. Phase compensation circuits may be implemented according to various design techniques. A particular example of such a design is shown in FIG. 2.

Figure 2:
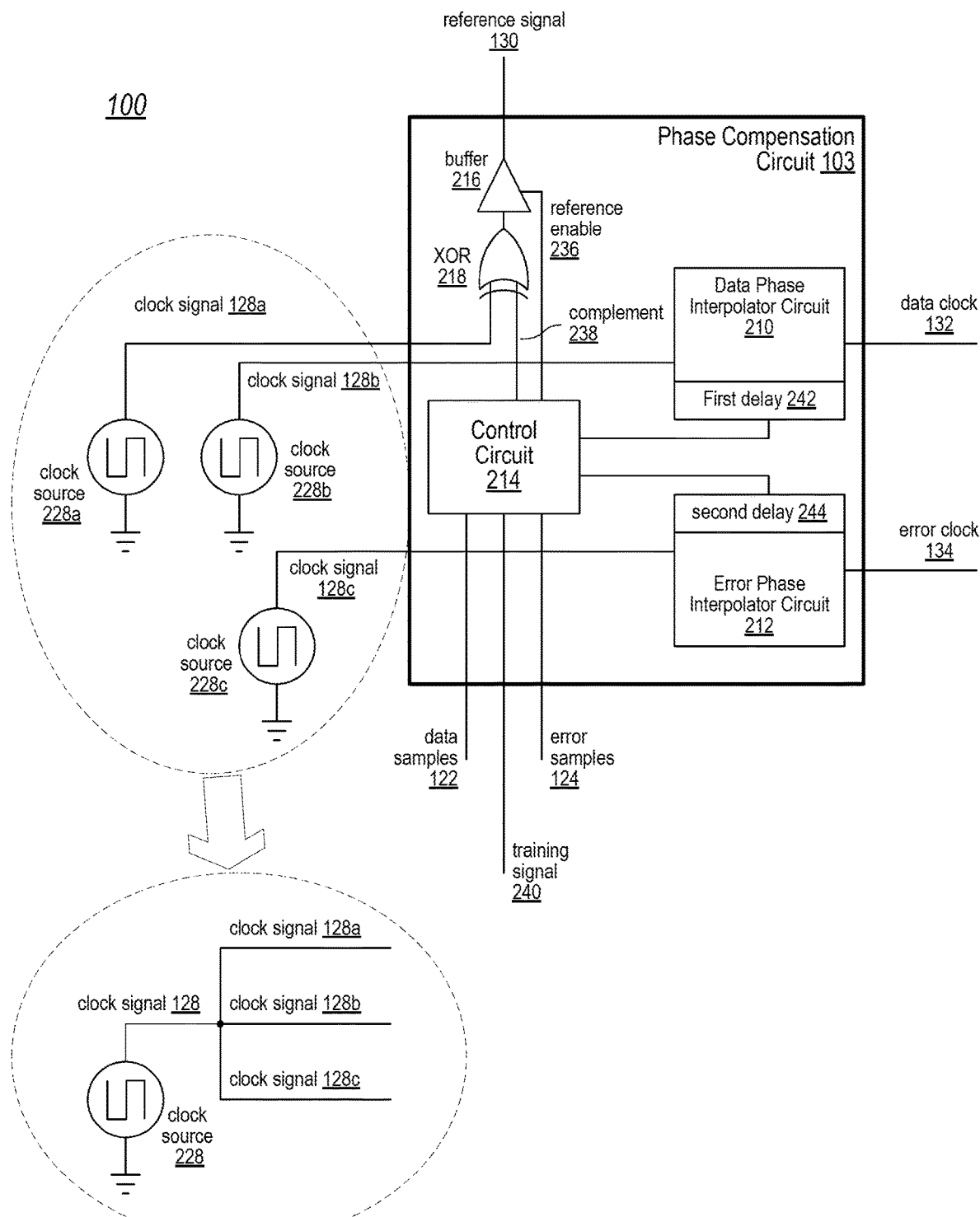
FIG. 2 shows a block diagram of an embodiment of a phase compensation circuit, as well as clock sources, used in a receiver system.

Moving to FIG. 2, a block diagram of an embodiment of phase compensation circuit 103 from FIG. 1 is shown. As illustrated, phase compensation circuit 103 includes data phase interpolator circuit 210 and error phase interpolator circuit 212, each coupled to control circuit 214. Control circuit 214, in various embodiments, may correspond to a dedicated state machine, sequential logic circuit, or a general-purpose processor. Phase compensation circuit 103 further includes buffer 216 coupled to exclusive-OR logic gate (XOR) 218. Phase compensation circuit 103 receives clock signals 128a, 128b, and 128c, and generates reference signal 130, data clock signal 132, and error clock signal 134. In addition, phase compensation circuit 103 also receives data samples 122, error samples 124 and training signal 240.

As described above, receiver circuit 100 may operate in a standard operating mode or a training mode which, as illustrated, is indicated by a state of training signal 240. In the standard operating mode, training signal 240 is de-asserted (e.g., in a logic low state). Control circuit 214 de-asserts reference enable signal 236, causing an output of buffer 216 to tri-state, thereby allowing signal node 110 to carry equalized signal 126 from receiver buffer 109. In addition, data phase interpolator circuit 210 is configured to generate data clock signal 132 using clock signal 128*b* and first delay value 242. In a similar manner, error phase interpolator circuit 212 is configured to generate error clock signal 134 using clock signal 128*c* and second delay value 244. First and second delay values 242 and 244 are set by control circuit 214. Based on first and second delay values 242 and 244, data phase interpolator circuit 210 and error phase interpolator circuit 212 delay transitions of clock signal 128*b* and 128*c*, respectively, to generate data clock signal 132 and error clock signal 134. While training signal 240 is de-asserted, first and second delay values 242 and 244 may remain at a constant value, resulting in a consistent phase difference between data clock signal 132 and error clock signal 134. In some cases, this phase difference may be near zero, and operation of receiver circuit 100 may continue to operate in the standard operating mode with an acceptable bit error rate.

As used herein, to "assert" or "asserting" a signal refers to driving the signal to a logic state that enables a particular function or indicates a particular event. Similarly, to "de-assert" or "de-asserting" the signal refers to driving the signal to a logic level that disables the particular function or indicates an end to the particular event. In various embodiments, an assertion of a signal may correspond to driving a logic high or a logic low state.

Over time, the phase difference may change, for example, due to changes in a supply voltage level, an operating temperature, or other operating condition that may affect the operation of receiver circuit 100 or characteristics of channel 112. If, as a result of the change to the phase difference, the bit error rate reaches a particular level, then training signal 240 may be asserted to initiate the training mode in order to reduce the phase difference between data clock signal 132 and error clock signal 134. When training signal 240 is asserted, receiver buffer 109 ceases to generate equalized signal 126 and reference enable signal 236 is asserted, allowing buffer 216 to generate reference signal 130 based on an output of XOR 218. The output of XOR 218 is based on clock signal 128*a* and a state of complement signal 238. At this stage, control circuit 214 de-asserts complement signal 238 and XOR 218, therefore, generates reference signal 130 based on clock signal 128*a*.

In the training mode, phase compensation circuit 103 is further configured to set first delay value 242 (for data phase interpolator circuit 210) and second delay value 244 (for error phase interpolator circuit 212) to respective initial values. For example, the initial values may correspond to a minimum delay setting for each of data phase interpolator circuit 210 and error phase interpolator circuit 212. Using these initial delay values to generate data clock signal 132 and error clock signal 134, data sampler circuit 105 and error sampler circuit 107 generate an initial one of data samples 122 and an initial one of error samples 124, respectively. Control circuit 214 receives and collects the initial one of data samples 122 and the initial one of error samples 124.

Control circuit 214 collects subsequent ones of data samples 122 and subsequent ones of error samples 124 by incrementing the first and second delay values 242 and 244 in response to collecting at least a subsequent one of data samples 122 and at least a subsequent one of error samples 124. In various embodiments, for each setting of the first and second delay values 242 and 244 in data phase interpolator circuit 210 and error phase interpolator circuit 212, control circuit 214 may collect any suitable number of data samples 122 and error samples 124. The suitable number may be one sample for each delay setting, thousands of samples for each delay setting or any number in between. Control circuit 214 may continue to increment first and second delay values 242 and 244, and collect corresponding samples for each increment, until a maximum delay value is reached for each of first and second delay values 242 and 244. In other embodiments, the incrementing and collecting of samples may end based on collecting particular values for both data samples 122 and error sample 124. For example, control circuit 214 may cease incrementing first delay value 242 after determining that collected ones of data samples 122 indicate a transition of reference signal 130, and cease incrementing second delay value 244 after detecting a similar indication of a transition from the collected ones of error samples 124. To adjust the phase difference between data clock signal 132 and error clock signal 134, control circuit 214 may adjusts the phase difference using at least some of the plurality of collected data samples and at least some of the plurality of collected complement error samples.

In some embodiments, phase compensation circuit 103 is further configured to, in response to a number of data samples 122 (and/or a number of error samples 124) having been generated, replace the reference signal with a complement reference signal. Control circuit 214 in response to a determination that a particular number of samples have been collected using reference signal 130, may assert complement signal 238. In other embodiments, control circuit 214 may assert complement signal 238 in response to determining that first and second delay values 242 and 244 have reached final values.

Assertion of complement signal 238 causes XOR 218 to generate an output signal that is the complement of clock signal 128*a*, thereby causing reference signal 130 to be complemented. In addition to complementing reference signal 130, control circuit 214 resets first and second delay values 242 and 244 to their respective initial values. Data sampler circuit 105 may then sample, using data clock signal 132, the complement of reference signal 130 to generate a plurality of complement data samples 122. In a similar manner, error sampler circuit 107 may sample, using error clock signal 134, the complement of reference signal 130 to generate a plurality of complement errors samples 124. Control circuit 214 collects samples from data samples 122 and error samples 124, and as described above, increments first and second delay values 242 and 244 after the suitable number of samples have been collected using the initial delay values. Control circuit 214 continues to increment and collect samples until a final delay value is reached for first and second delay values 242 and 244. To adjust the phase difference between data clock signal 132 and error clock signal 134, control circuit 214 may adjusts the phase difference using at least some of the plurality of collected complement data samples and at least some of the plurality of collected complement error samples, in combination with the previously collected data samples and error samples.

It is noted that control circuit 214 is described as, in the training mode, starting with a minimum delay value for first and second delay values 242 and 244 and incrementing the delay values to collect samples. In other embodiments, however, control circuit 214 may start with a maximum delay value for the initial values of first and second delay values 242 and 244 and then decrement the delay values after collecting corresponding samples, stopping, for example, when a minimum delay value is reached for first and second delay values 242 and 244.

Two embodiments are illustrated in FIG. 2 for generating clock signals 128a-128c. In a first embodiment, each of clock signals 128a-128c are generated using a respective one of clock sources 228a-228c. In some embodiments, each of clock sources 228a-228c may operate independently. Clock source 228b and 228c may be configured to generate respective clock signals 128b and 128c with a same frequency. In the second embodiment, reference signal 130, data clock signal 132, and error clock signal 134 are generated from a same clock signal source, clock source 228. In this second embodiment, an output signal of clock source 228 is sent to each of XOR 218, data phase interpolator circuit 210 and error phase interpolator circuit 212. Using a same clock source for data clock signal 132 and error clock signal 134 may, in some embodiments, reduce an amount of phase difference between the two clock signals. Routing differences, manufacturing anomalies, and the like may, however, still result in phase differences that can be reduced using phase compensation circuit 103.

It is noted that the embodiment of FIG. 2 is merely an example to demonstrate the disclosed concepts. In other embodiments, a different combination of circuits may be included. For example, in the illustrated embodiment, phase interpolator circuits are used to delay the clock signals to generate the data and error clock signals. Other types of delay circuits are known and are contemplated for use in place of the phase interpolator circuits.

FIGS. 1 and 2 illustrate block diagrams of circuits that may be used in a receiver circuit and corresponding phase compensation circuit. The operations of these circuits may generate a variety of waveforms. An example of waveforms generated during operation of a receiver circuit during a training mode is depicted in FIG. 3.

Figure 3:
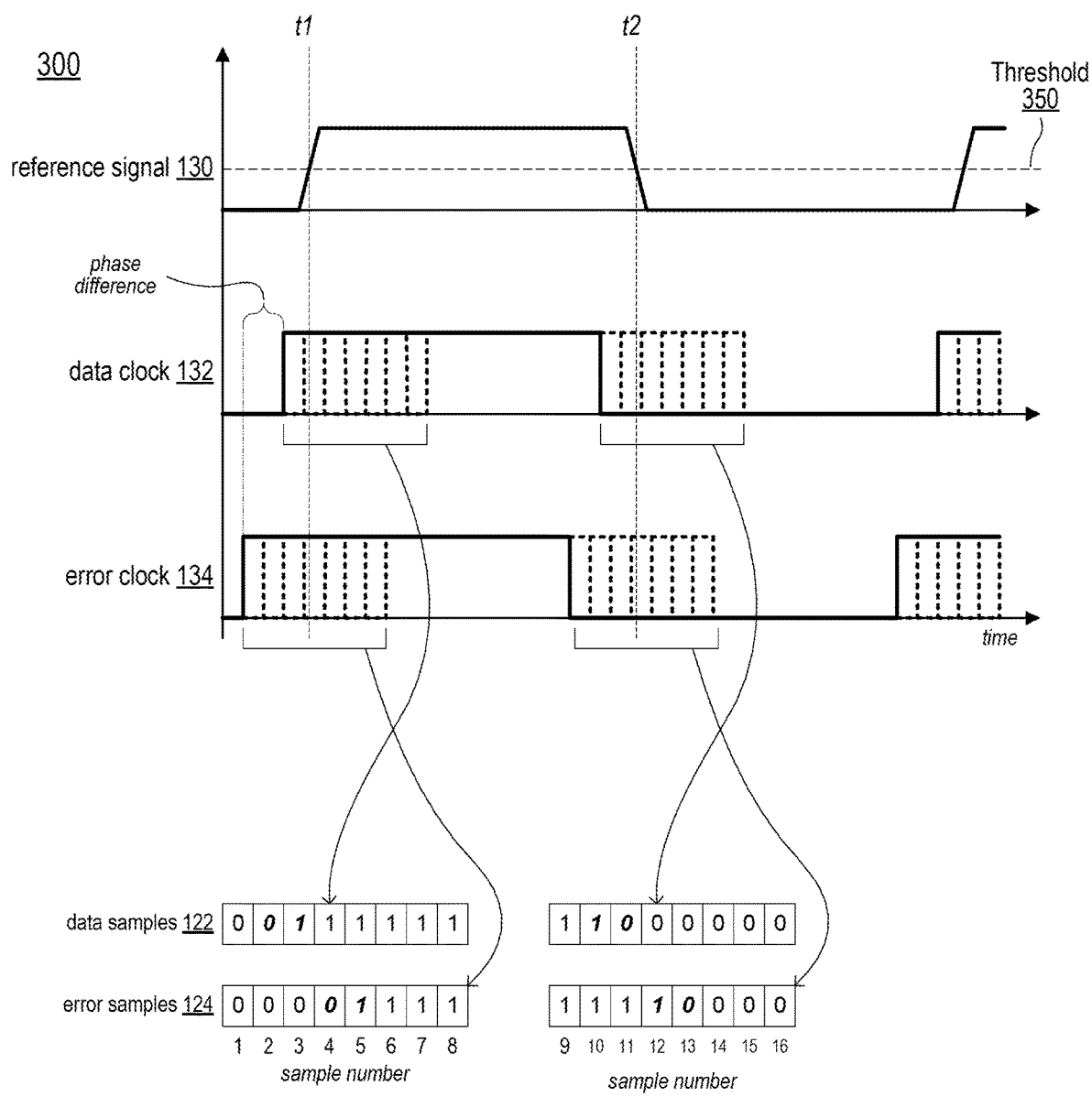
FIG. 3 depicts a chart of waveforms associated with an embodiment of a receiver system.

Turning to FIG. 3, a chart showing three waveforms associated with an embodiment of a receiver circuit, such as receiver circuit 100 in FIG. 1, is illustrated. The waveforms of chart 300 include reference signal 130, data clock signal 132 and error clock signal 134. Threshold 350 is shown with reference signal 130 to indicate a threshold voltage for when reference signal 130 is detected as a logic low or a logic high. In the embodiment of FIG. 3, data sampler circuit 105 and error sampler circuit 107 have the same threshold voltage of threshold 350. Reference signal 130 is a clock signal that repeats the illustrated waveform until the reference signal is disabled. The solid line in the waveforms for data clock signal 132 and error clock signal 134 indicate the clock signals for initial samples using initial values for first and second delay values 242 and 244. The dotted lines in the waveforms indicate subsequent transition points for the clock signals as control circuit 214 (in FIG. 2) increments first and second delay values 242 and 244 to move the sampling points of data sampler circuit 105 and error sampler circuit 107. Also shown in chart 300 are sampled values for data samples 122 and error samples 124 corresponding to the different sampling points.

As illustrated, a phase difference between data clock signal 132 and error clock signal 134 is indicated and receiver circuit 100 is in the training mode to identify and reduce the phase difference. As shown, error clock signal 134 transitions before data clock signal 132. Reference signal 130 is a periodic signal that is repeated during the training mode. Various ones of the dotted lines in data clock signal 132 and error clock signal 134 depict a respective delay value for a particular iteration of reference signal 130. For example, the one solid rising transition and seven dotted rising transitions on data clock signal 132 that occur near time t1, each represent a respective one iteration of reference signal 130. Accordingly, "time t1" does not depict a single point in time, but instead a repeating point in time when a rising transition of reference signal 130 crosses threshold 350.

As described above, control circuit 214 from FIG. 2 sets both first delay value 242 for data phase interpolator circuit 210 and second delay value 244 for error phase interpolator circuit 212 to respective initial values. Due to the phase difference, the initial transitions for data clock signal 132 and error clock signal 134 do not occur at the same point in time, causing error sampler circuit 107 to sample reference signal 130 earlier than data sampler circuit 105.

The initial samples for both data samples 122 and error samples 124 are logic low values ('0'). Data sampler circuit 105 captures one additional sample of reference signal 130 with a logic low value before reference signal 130 transitions to a logic high value, as shown by sample number 2 of data samples 122. Error sampler circuit 107, however, captures three additional samples of reference signal 130 with a logic low value before reference signal 130 transitions to the logic high value, as shown by sample numbers 2-4 for error samples 124.

At time t1, the voltage level of reference signal 130 rises above threshold 350, and remains above threshold 350 until time t2. Samples of reference signal 130 taken between times t1 and t2 result in logic high values. Since data clock signal 132 lags behind error clock signal 134, data sampler circuit 105 captures six data samples 122 with logic high values, as shown in sample numbers 3-8. Error sampler circuit 107 only captures four error samples 124 with logic high values, as shown in samples 5-8.

Similarly, at the falling transition of reference signal 130 at time t2, two data samples 122 are captured with logic high values and six with logic low values, as shown in samples 9-16. In contrast, four error samples 124 are captured with logic high values (sample numbers 9-12), followed by four logic low values (sample numbers 13-16).

Using the collected data samples 122 and error samples 124, control circuit 214 determines that data clock signal 132 lags behind error clock signal 134 by two sample times. For example, to adjust the phase difference between data clock signal 132 and error clock signal 134, phase compensation circuit 103 determines a data transition time indicative of when a transition of reference signal 130 is detected on data sampler circuit 105 (e.g., between sample numbers 2 and 3), and determines an error transition time indicative of when the same transition of reference signal 130 is detected on error sampler circuit 107 (e.g., between sample numbers 4 and 5). Phase compensation circuit 103 may then determine the phase difference using the data transition time and the error transition time (e.g., two sample times).

Control circuit 214 may then change a setting of error phase interpolator circuit 212 to increase a delay of error clock signal 134 by two sample times. For example, if control circuit 214 increments the delay times by two picoseconds for each sample, then control circuit 214 adds four picoseconds to the delay of error clock signal 134. Alternatively, instead of increasing a delay of error clock signal 134, control circuit 214 may reduce a delay of data clock signal 132 by four picoseconds, or control circuit 214 may split the changes in the delays between error clock signal 134 and data clock signal 132 (e.g., add two picoseconds to the delay of error clock signal 134 and reduce the delay of data clock signal 132 by two picoseconds).

The waveforms of chart 300 assume that the threshold voltage of the input nodes of data sampler circuit 105 and error sampler circuit 107 have the same value of threshold 350. If, however, data sampler circuit 105 has a different input threshold voltage than error sampler circuit 107 then data sampler circuit 105 may detect the transitions of reference signal 130 at different points in time than error sampler circuit 107, even when there is no phase difference between data clock signal 132 and error clock signal 134. Such an example is illustrated in FIG. 4.

Figure 4:
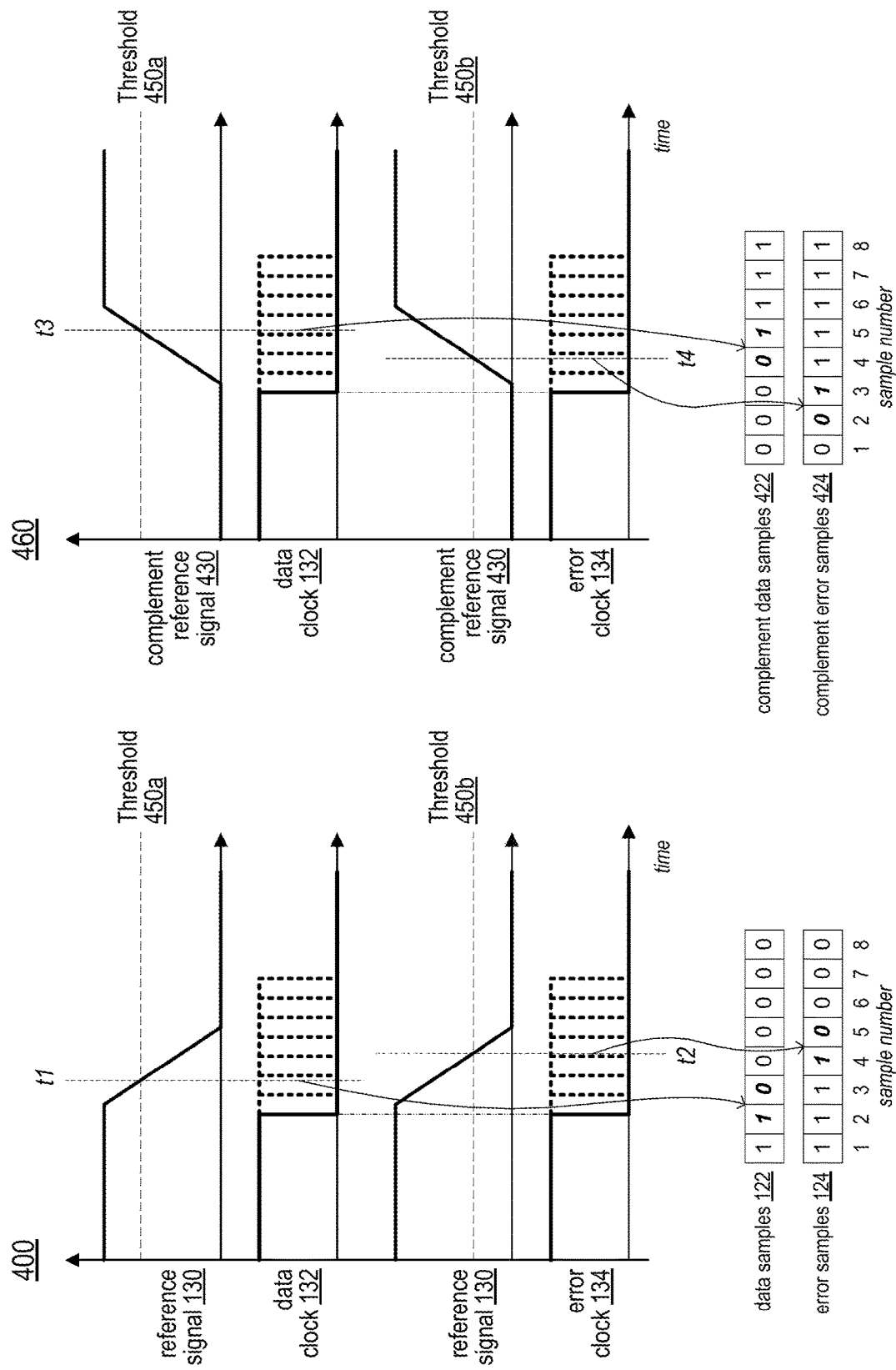
FIG. 4 illustrates two charts of waveforms associated with an embodiment of a receiver system with a threshold voltage offset.

Proceeding to FIG. 4, two charts are illustrated that depict waveforms associated with an embodiment of a receiver circuit with a data sampler circuit and an error sampler circuit that have different input voltage thresholds. Four waveforms are shown in chart 400, reference signal 130 with threshold 450a, data clock signal 132, reference signal 130 with threshold 450b, and error clock signal 134. As illustrated, threshold 450a represents the input threshold voltage of data sampler circuit 105 while threshold 450b represents the input threshold voltage of error sampler circuit 107. The waveform of reference signal 130 is repeated to clearly illustrate results of the different thresholds 450a and 450b.

In the example of chart 400, the input threshold voltage of data sampler circuit 105 is greater than the input threshold voltage of error sampler circuit 107. In various embodiments, this difference may either be an intentional difference by design, or an undesired difference due to a manufacturing anomaly or a circuit design mismatch between data sampler circuit 105 and error sampler circuit 107. The different voltage levels of thresholds 450a and 450b result in data sampler circuit 105 detecting a falling transition of reference signal 130 at time t1, between sample numbers 2 and 3 of data samples 122. Due to the lower threshold 450b, error sampler circuit 107 detects the same falling transition of reference signal 130 at time t2, between sample numbers 4 and 5 of error samples 124. It is noted that there is no discernable phase difference between data clock signal 132 and error clock signal 134 in chart 400, yet the data transition time and the error transition time differ by two sample times. This may cause control circuit 214 to attempt to increase a delay of data clock signal 132 or reduce a delay of error clock signal 134, which may introduce a phase difference when one does not currently exist.

To mitigate effects of the different input thresholds 450a and 450b in the illustrated embodiment, control circuit 214, after collecting a sufficient number of data sample 122 and error samples 124, asserts complement signal 238 shown in FIG. 2. The assertion of complement signal 238 causes reference signal 130 to be complemented. Complement reference signal 430 is shown as two waveforms in chart 460, one with threshold 450a and the other with threshold 450b. Data clock signal 132 and error clock signal 134 are also included in chart 460.

Rising transitions of complement reference signal 430 correspond to falling transitions of reference signal 130, and vice versa. The higher voltage level of threshold 450a may cause data sampler circuit 105 to detect the rising transition of complement reference signal 430 at time t3, later than it detected the corresponding falling transition of reference signal 130. Referring to complement data samples 422, the data transition time falls between sample numbers 4 and 5 as compared to sample numbers 2 and 3 for data samples 122. The lower voltage level of threshold 450b may create an opposite effect. Error sampler circuit 107 detects the rising transition of complement reference signal 430 at time t4, earlier than it detected the corresponding falling transition of reference signal 130. The error transition time falls between sample numbers 2 and 3 of complement error samples 424, as compared to sample numbers 4 and 5 for error samples 124.

Control circuit 214 may average the data transition time detected with reference signal 130 to the data transition time detected with complement reference signal 430, and do the same with the error transition times. In the embodiment of FIG. 4, this results in the data transition time and the error transition time each falling between sample numbers 3 and 4. In response to determining a same value for the data transition time and the error transition time, control circuit 214 may not change first or second delay values 242 and 244 since data clock signal 132 and error clock signal 134 started this training mode with no discernable phase difference.

It is noted that, in some embodiments, a training mode may not be entered when there is not a phase difference between the data and error clocks. The embodiment of FIG. 4 is show with no phase difference in order to highlight an impact of the different input threshold voltage levels between the data sampler circuit and the error sampler circuit.

It is further noted that the waveforms shown in both FIGS. 3 and 4 are merely examples to demonstrate the disclosed concepts. In other embodiments, waveforms may appear different due to circuit designs used to implement receiver circuit 100, manufacturing limitations creating less than ideal circuit elements, coupled signal noise from circuits adjacent to receiver circuit 100, and the like.

Figure 5:
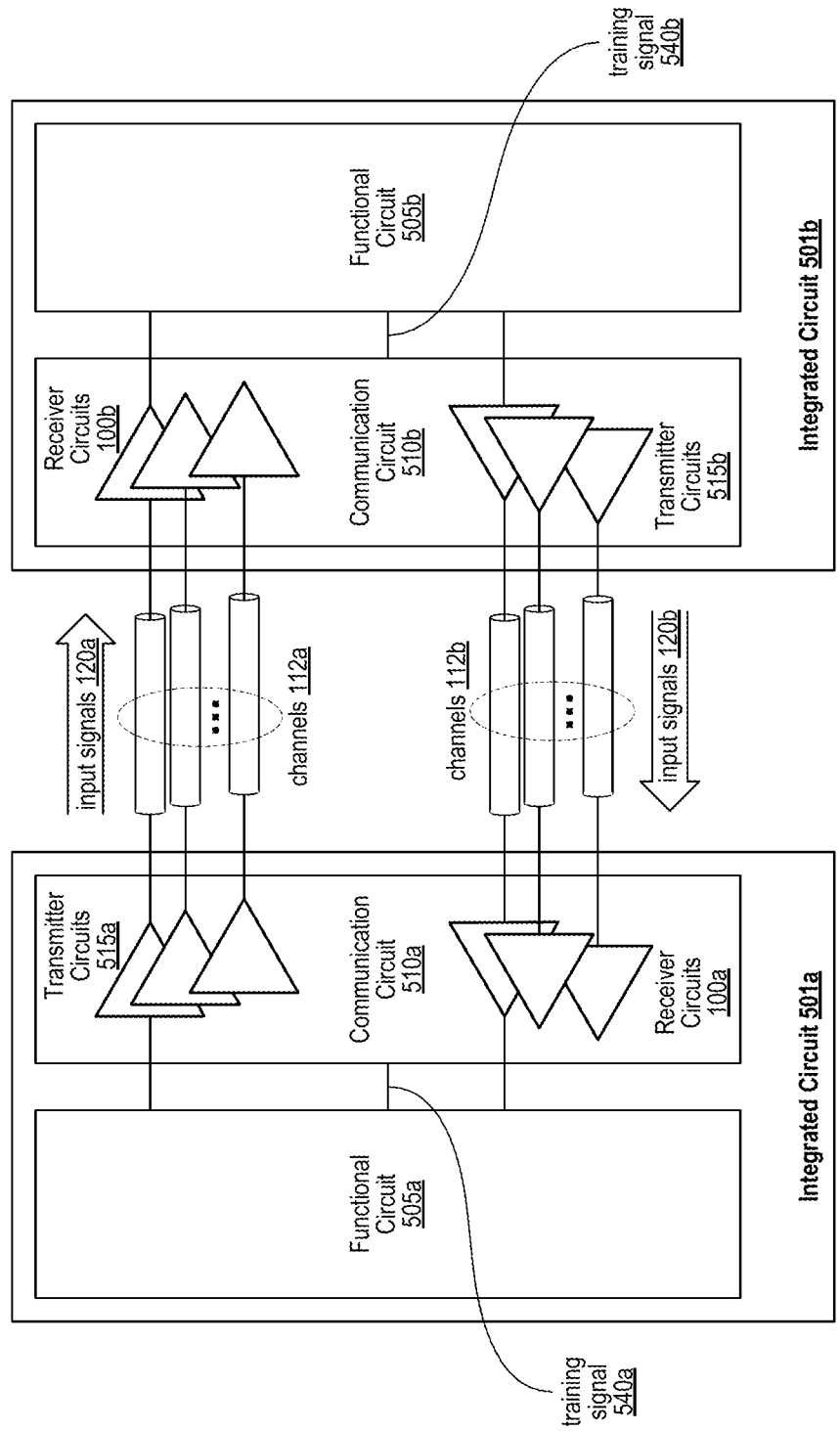
FIG. 5 depicts a block diagram of a computing system that utilizes a receiver system such as shown in FIG. 1.

FIGS. 1-4 have focused on various aspects of a receiver circuit. Receiver circuits may be implemented within a variety of applications to implement various communication interfaces. FIG. 5 illustrates one such application.

Moving now to FIG. 5, a system is depicted that includes two integrated circuits that communicate via a plurality of transmitter circuits and receiver circuits such as receiver circuit 100 in FIG. 1. System 500 includes integrated circuits 501a and 501b (collectively integrated circuits 501), coupled via communication channels 112a and 112b. Communication channels 112a and 112b may collectively form a data bus to support communication between integrated circuits 501a and 501b. Each integrated circuit 501 includes a respective functional circuit 505 (505a and 505b) and communication circuit 510 (510a and 510b). Each of communication circuits 510 include respective sets of receiver circuits 100 (100a and 100b) and transmitter circuits 515 (515a and 515b).

As illustrated, to communicate, integrated circuit 501a sends input signals 120a to integrated circuit 501b via communication channels 112a and receives input signals 120b from integrated circuit 501b via communication channels 112a. Each transmitter 515a in communication circuit 510 may be coupled to a respective one of receivers 100b in communication circuit 510b by a corresponding one of communication channels 112a. In a similar manner, each of receiver circuits 100a may be coupled to a respective one of transmitter circuits 515b by a corresponding communication channel 112b. In various embodiments, communication channels may be wire trances on a circuit board, a cable connected between two circuit boards in a computing device, one or more cables connecting two or more computing devices, or combinations thereof.

Each of receiver circuits 100a and 100b, as shown, correspond to respective ones of receiver circuit 100 in FIG. 1. While functional circuits 505a and 505b de-assert respective training signals 540a and 540b, receiver circuits 100 may operate in the standard operating mode as described above. In the standard operating mode, receiver circuits 100 may receive information sent by corresponding ones of transmitter circuits 515. For example, integrated circuit 501*a* may be a system-on-chip processing device (SoC) while integrated circuit 501*b* may be a memory device used to store and retrieve information for the SoC. In such an embodiment, functional circuit 505*a* may include one or more processing cores while functional circuit 505*b* may include a memory controller circuit coupled to one or more memory arrays. The SoC sends information to be stored and requests to read stored information to the memory device via input signals 120*a*. The memory device sends requested information and acknowledgements to store information back to the SoC via input signals 120*b*.

Functional circuit 505*a* may assert training signal 540*a* and functional circuit may likewise assert training signal 540*b* in response to detecting one or more events. Such events may include a power-on event, a reset recovery condition, or other similar events that may cause a corresponding communication circuit 510 to be initialized for sending and receiving information. In addition, either of functional circuits 505 may assert their respective training signal 540 in response to a determination that a bit error rate for the corresponding communication circuit 510 has reached a threshold level. Receiver circuits 100 detecting an assertion of a training signal 540 transition from the standard operating mode to the training mode that is described above. In addition to the training that is described herein, receiver circuits 100 may undergo additional training operations in order to reduce their respective bit error rate.

It is noted that FIG. 5 is merely an example. The block diagrams of integrated circuits 501 have been simplified for clarity. In other embodiments, additional circuit blocks may be included, such as memory blocks, power management circuits, clock generation circuits, and the like. Although the embodiment of FIG. 5 only shows two integrated circuits, any suitable number of integrated circuits may be coupled to communicate using circuits such as communication circuits 510.

The circuits described above in FIGS. 1, 2, and 5 may perform training operations using a variety of methods. Two such methods for conduction training operations on a receiver circuit are described in FIGS. 6 and 7.

Figure 6:
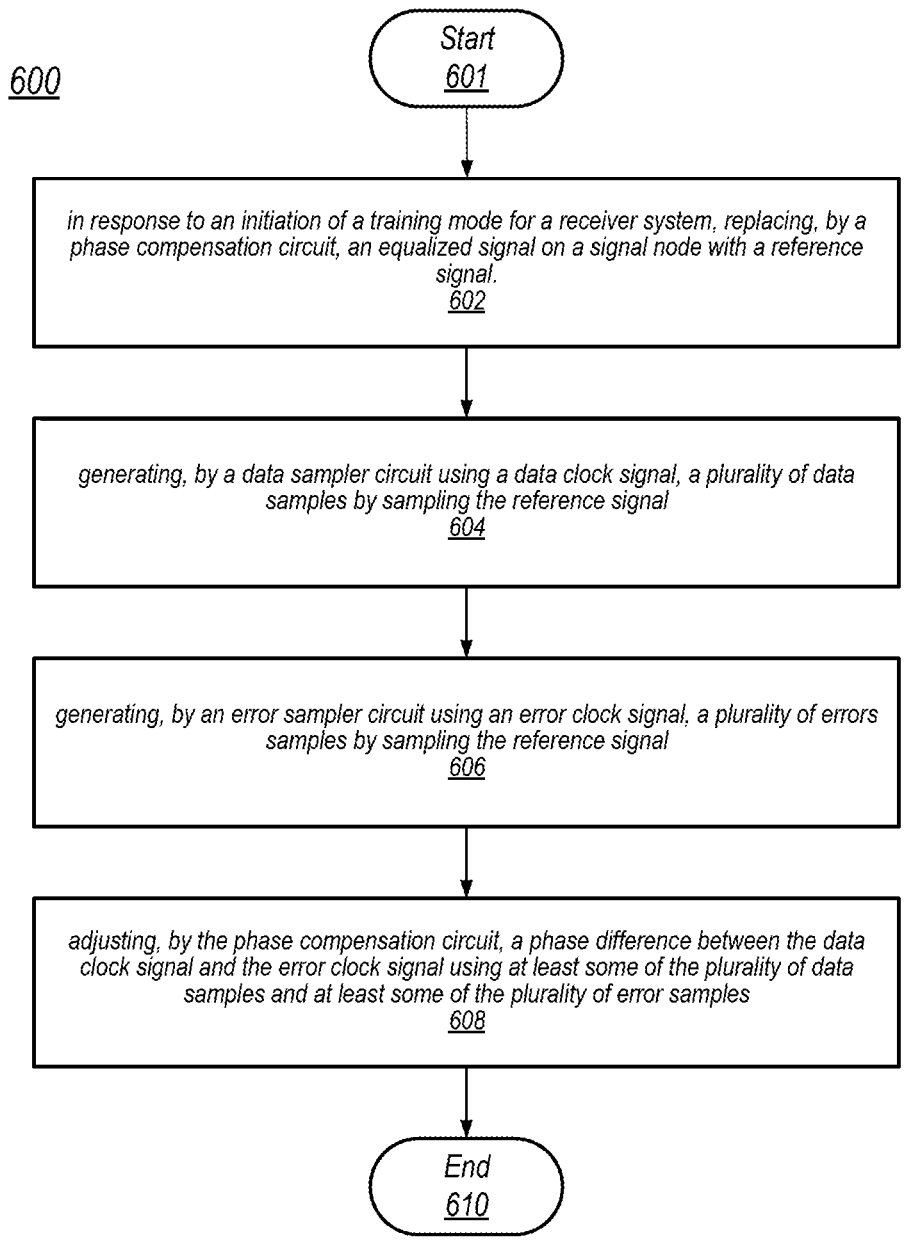
FIG. 6 illustrates a flow diagram of an embodiment of a method for training a communication channel in a receiver system utilizing a reference signal.

Turning now to FIG. 6, a flow diagram for an embodiment of a method for adjusting a phase difference between a data clock signal and an error clock signal in a receiver circuit is shown. Method 600 may be performed by a receiver circuit, for example, receiver circuit 100 in FIG. 1. Referring collectively to FIGS. 1 and 6, method 600 begins in block 601.

At block 602, in the illustrated embodiment, the method includes, in response to an initiation of a training mode for a receiver system, replacing, by a phase compensation circuit, an equalized signal on a signal node with a reference signal. A functional circuit, such as functional circuit 505*a* in FIG. 5, may assert training signal 540*a* to indicate a transition to the training mode. The transition to the training mode may be due to an increase of a bit error rate for information received by receiver circuit 100, due to an elapsed timing window for performing periodic training of receiver circuit 100, due to a change in state from a low power or idle state to an active state, or other such events. In response to the assertion of training signal 540*a*, receiver buffer 109 ceases to generate equalized signal 126 on signal node 110, and instead phase compensation circuit 103 generates reference signal 130 on signal node 110.

Method 600 further includes, at block 604, generating, by a data sampler circuit using a data clock signal, a plurality of data samples by sampling the reference signal. Data sampler circuit 105 receives reference signal 130 and captures data samples 122 of reference signal 130 based on transitions of data clock signal 132. In various embodiments, data sampler circuit 105 may capture data samples 122 in response to a rising transition of data clock signal 132, a falling transition, or in response to both rising and falling transitions of data clock signal 132. To generate data samples 122, phase compensation circuit 103 starts the sampling with an initial value of first delay value 242 used to delay transitions of data clock signal 132. After capturing a particular number of samples using the initial value for first delay value 242, phase compensation circuit 103 increments first delay value 242 during the generating of the plurality of data samples 122. Another particular number of data samples 122 are collected and then first delay value 242 is incremented again. This process may repeat until a final value for first delay value 242 has been reached. In other embodiments, the collection of data samples 122 may end in response to detecting a transition in the values of the samples. Phase compensation circuit 103 receives and stores data samples 122.

At block 606, method 600 includes generating, by an error sampler circuit using an error clock signal, a plurality of errors samples by sampling the reference signal. In a similar manner as data sampler circuit 105, error sampler circuit 107 also receives reference signal 130 and captures error samples 124 based on transitions of error clock signal 134. As with data sampler circuit 105, error sampler circuit 107 may capture error samples 124 in response to rising transitions, falling transitions, or both rising and falling transitions on error clock signal 134. Error samples 124 may be generated in a similar manner as data samples 122. Phase compensation circuit 103 starts the sampling with an initial value for second delay value 244 used to delay transitions of error clock signal 134. After capturing the particular number of samples using the initial value for second delay value 244, phase compensation circuit 103 increments second delay value 244 on error clock signal 134 during the generating of the plurality of error samples 124. The collection of error samples 124 may end based on reaching a final value for second delay value 244 or in response to detecting a transition in the values of error samples 124. Phase compensation circuit 103 receives and stores error samples 124.

Method 600 also includes, at block 608, adjusting, by the phase compensation circuit, a phase difference between the data clock signal and the error clock signal using at least some of the plurality of data samples and at least some of the plurality of error samples. For example, phase compensation circuit 103 may identify two consecutive data samples of the plurality of data samples 122 with different values for the state of reference signal 130. These different values may indicate a transition of reference signal 130 (e.g., from a logic low state to a logic high state, or vice versa). Phase compensation circuit 103 may repeat this process for error samples 124, identifying two consecutive error samples of the plurality of error samples 124 with different values for reference signal 130.

Phase compensation circuit 103 may then determine the phase difference using the two consecutive data samples and the two consecutive error samples. For example, phase compensation circuit 103 determines two points in time when the transition of reference signal 130 occurs, one point in time based on data samples 122 and the other based on error samples 124. A difference between these two points in time may correspond to the phase difference. To adjust the phase difference between the data clock signal and the error clock signal, phase compensation circuit 103 may adjust first delay value 242 for data clock signal 132, adjust second delay value 244 for error clock signal 134, or make a combination of adjustments to both first and second delay values 242 and 244. The method ends in block 610.

In some embodiments, various differences between data sampler circuit 105 and error sampler circuit 107 may result in different input thresholds for each circuit. In other embodiments, differences in signal routing to each of data sampler circuit 105 and error sampler circuit 107 may result in reference signal 130 having a different voltage level at the input nodes of each sampler circuit. In some embodiments, phase compensation circuit 103 may perform an additional method to mitigate effects due to circuit and/or routing differences that may affect when each of data sampler circuit 105 and error sampler circuit 107 detect a transition in the state of reference signal 130. An example of such a method is provided by FIG. 7.

Figure 7:
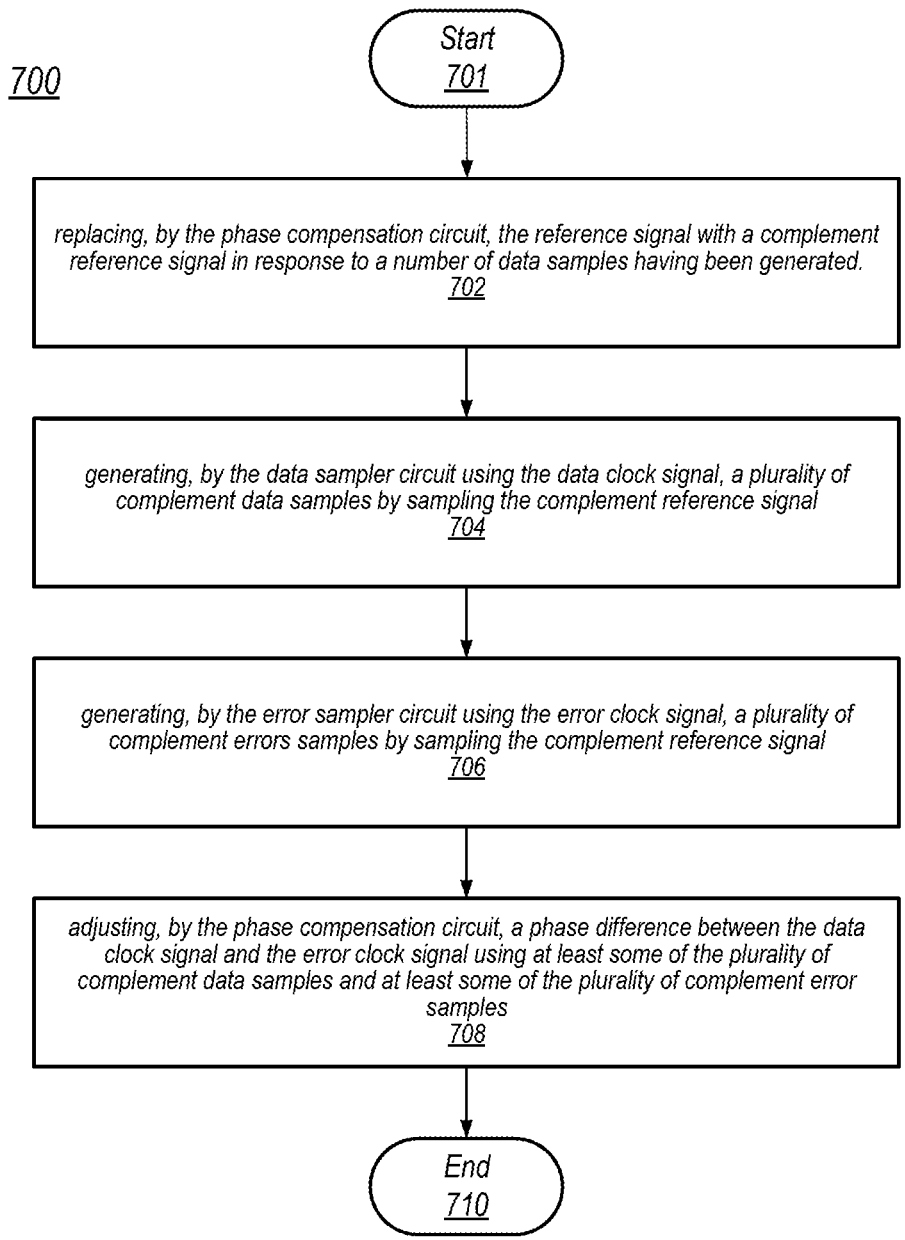
FIG. 7 shows a flow diagram of an embodiment of a method for training a communication channel in a receiver system utilizing a complement reference signal.

Proceeding now to FIG. 7, a flow diagram of a method for adjusting a phase difference between a data clock signal and an error clock signal using a complement reference signal is illustrated. Method 700 may be performed by a receiver circuit such as receiver circuit 100 in FIG. 1. In some embodiments, method 700 may be performed in combination with method 600 in FIG. 6. For example, method 700 may be performed in whole, or in part, between operations 606 and 608, or in place of operation 608, of method 600. Referring collectively to FIGS. 1, 2, and 7, method 700 begins in block 701 with block 606 of method 600 having been completed.

At block 702, method 700 includes replacing the reference signal with a complement reference signal in response to a number of data samples having been generated. As shown, phase compensation circuit 103 replaces reference signal 130 with a complement reference signal, for example, by asserting complement signal 238. The assertion of complement signal 238 causes XOR 218 to complement its output signal. In some embodiments, the number of data samples collected before complementing the reference signal may be constant. For example, phase compensation circuit 103 may collect n number of data samples 122 and error samples 124 for each value of first and second delay values 242 and 244 used from a particular initial delay value to a particular final delay value. In other embodiments, the number of data samples collected before complementing the reference signal may vary dependent on detecting a first transition between consecutive samples of data samples 122 and a second transition between consecutive ones of error samples 124.

Method 700 further includes, at block 704, generating, by the data sampler circuit using the data clock signal, a plurality of complement data samples by sampling the complement reference signal. As described above, data sampler circuit 105 samples the complement reference signal in response to detecting a transition on data clock signal 132. In various embodiments, samples may be taken in response to rising, falling, or both types of transitions. The generated complement data samples are collected by phase compensation circuit 103.

At block 706, method 700 further includes generating, by the error sampler circuit using the error clock signal, a plurality of complement errors samples by sampling the complement reference signal. In a similar manner as data sampler circuit 105, error sampler circuit 107 samples the complement reference signal in response to detecting a transition on error clock signal 134. Samples may, again, be taken in response to rising, falling, or both types of transitions. The generated complement error samples are collected by phase compensation circuit 103.

Method 700 also includes, at block 708, adjusting, by the phase compensation circuit, the phase difference using at least some of the plurality of complement data samples and at least some of the plurality of complement error samples. For example, phase compensation circuit 103 may use a first data transition time determined from the data samples of reference signal 130 and a second data transition time determined from the data samples of the complement reference signal to determine (e.g., by averaging) an overall data transition time. Similarly, phase compensation circuit 103 may determine a first error transition time based on a transition detected in the error samples from reference signal 130 and a second error transition time based on a transition detected in the error samples of the complement reference signal. An overall error transition time is determined, for example by averaging the first and second error transition times. A difference between the overall data transition time and the overall error transition time may correspond to the phase difference. To adjust the phase difference, phase compensation circuit 103 may adjust first delay value 242 for data clock signal 132, adjust second delay value 244 for error clock signal 134, or make a combination of adjustments to both first and second delay values 242 and 244. The method ends in block 710.

It is noted that methods 600 and 700 of FIGS. 6 and 7 are merely examples. Variations of the disclosed methods are contemplated. For example, the reference signal is described as being complemented after all samples of the uncomplemented reference signal are collected. In other embodiments, for each increment of first and second delay values 242 and 244, both uncomplemented and complemented data and error samples may be collected.

Figure 8:
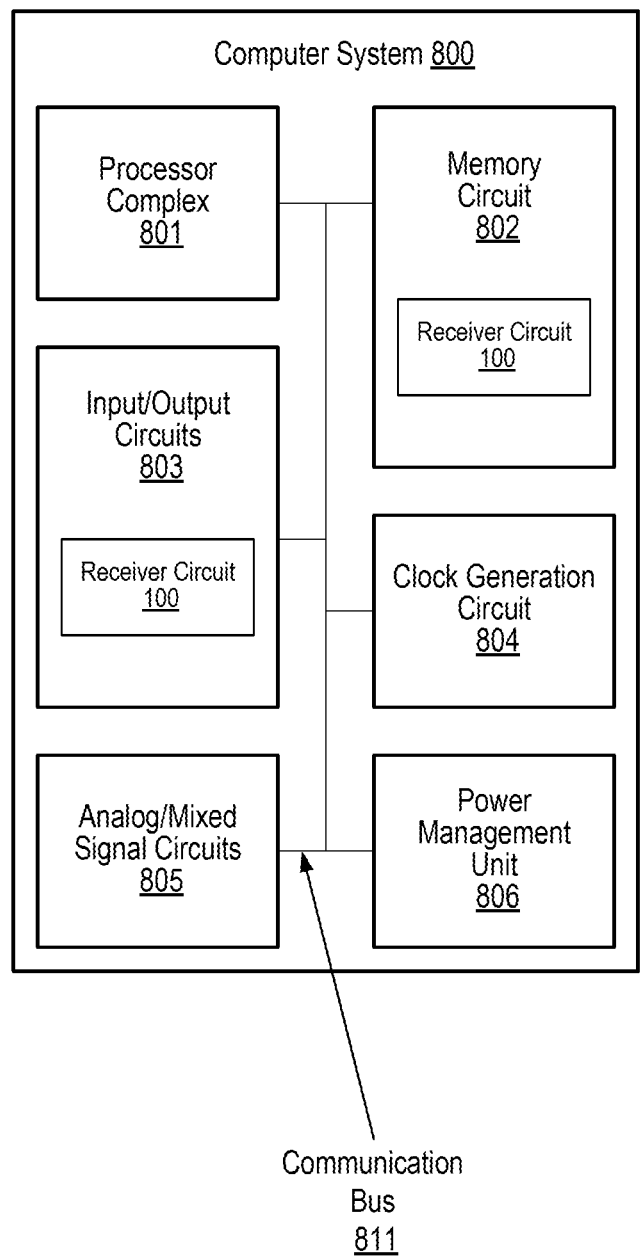
FIG. 8 depicts a block diagram of an embodiment of a computer system that includes a receiver system.

FIGS. 1-7 illustrate apparatus and methods for a receiver circuit in a communication system. Receiver circuits, such as those described above, may be used in a variety of computer systems, such as a desktop computer, laptop computer, smartphone, tablet, wearable device, and the like. In some embodiments, the circuits described above may be implemented on a system-on-chip (SoC) or other type of integrated circuit. A block diagram illustrating an embodiment of computer system 800 that includes the disclosed circuits is illustrated in FIG. 8. Computer system 800 may, in some embodiments, correspond to integrated circuit 501a and/or 501b in FIG. 5. As shown, computer system 800 includes processor complex 801, memory circuit 802, input/output circuits 803, clock generation circuit 804, analog/mixed-signal circuits 805, and power management unit 806. These functional circuits are coupled to each other by communication bus 811. As shown, both memory circuit 802 and input/output circuits 803 include respective embodiments of receiver circuit 100.

Processor complex 801, in various embodiments, may be representative of a general-purpose processor that performs computational operations. For example, processor complex 801 may be a central processing unit (CPU) such as a microprocessor, a microcontroller, an application-specific integrated circuit (ASIC), or a field-programmable gate array (FPGA). In some embodiments, processor complex 801 may correspond to a special purpose processing core, such as a graphics processor, audio processor, or neural processor, while in other embodiments, processor complex 801 may correspond to a general-purpose processor configured and/or programmed to perform one such function. Processor complex 801, in some embodiments, may include a plurality of general and/or special purpose processor cores as well as supporting circuits for managing, e.g., power signals, clock signals, and memory requests. In addition, processor complex 801 may include one or more levels of cache memory to fulfill memory requests issued by included processor cores.

Memory circuit 802, in the illustrated embodiment, includes one or more memory circuits for storing instructions and data to be utilized within computer system 800 by processor complex 801. In various embodiments, memory circuit 802 may include any suitable type of memory such as a dynamic random-access memory (DRAM), a static random access memory (SRAM), a read-only memory (ROM), electrically erasable programmable read-only memory (EEPROM), or a non-volatile memory, for example. It is noted that in the embodiment of computer system 800, a single memory circuit is depicted. In other embodiments, any suitable number of memory circuits may be employed. In some embodiments, memory circuit 802 may include a memory controller circuit as well communication circuits for accessing memory circuits external to computer system 800, such as a DRAM module 560 in FIG. 5. One or more embodiments of receiver circuit 100 may be included as part of such communication circuits.

Input/output circuits 803 may be configured to coordinate data transfer between computer system 800 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 803 may be configured to implement a version of Universal Serial Bus (USB) protocol or IEEE 1394 (Firewire®) protocol.

Input/output circuits 803 may also be configured to coordinate data transfer between computer system 800 and one or more devices (e.g., other computing systems or integrated circuits) coupled to computer system 800 via a network. In one embodiment, input/output circuits 803 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. As illustrated, input/output circuits 803 include one or more instances of receiver circuit 100 to support various communication interfaces.

Clock generation circuit 804 may be configured to enable, configure and manage outputs of one or more clock sources. In various embodiments, the clock sources may be located in analog/mixed-signal circuits 805, within clock generation circuit 804, in other blocks with computer system 800, or come from a source external to computer system 800, coupled through one or more I/O pins. In some embodiments, clock generation circuit 804 may be capable of enabling and disabling (e.g., gating) a selected clock source before it is distributed throughout computer system 800. Clock generation circuit 804 may include registers for selecting an output frequency of a phase-locked loop (PLL), delay-locked loop (DLL), frequency-locked loop (FLL), or other type of circuits capable of adjusting a frequency, duty cycle, or other properties of a clock or timing signal.

Analog/mixed-signal circuits 805 may include a variety of circuits including, for example, a crystal oscillator, PLL or FLL, and a digital-to-analog converter (DAC) (all not shown) configured to generated signals used by computer system 800. In some embodiments, analog/mixed-signal circuits 805 may also include radio frequency (RF) circuits that may be configured for operation with cellular telephone networks. Analog/mixed-signal circuits 805 may include one or more circuits capable of generating a reference voltage at a particular voltage level, such as a voltage regulator or band-gap voltage reference.

Power management unit 806 may be configured to generate a regulated voltage level on a power supply signal for processor complex 801, input/output circuits 803, memory circuit 802, and other circuits in computer system 800. In various embodiments, power management unit 806 may include one or more voltage regulator circuits, such as, e.g., a buck regulator circuit, configured to generate the regulated voltage level based on an external power supply (not shown). In some embodiments any suitable number of regulated voltage levels may be generated. Additionally, power management unit 806 may include various circuits for managing distribution of one or more power signals to the various circuits in computer system 800, including maintaining and adjusting voltage levels of these power signals. Power management unit 806 may include circuits for monitoring power usage by computer system 800, including determining or estimating power usage by particular circuits.

It is noted that the embodiment illustrated in FIG. 8 includes one example of a computer system. A limited number of circuit blocks are illustrated for simplicity. In other embodiments, any suitable number and combination of circuit blocks may be included. For example, in other embodiments, security and/or cryptographic circuit blocks may be included.

Figure 9:
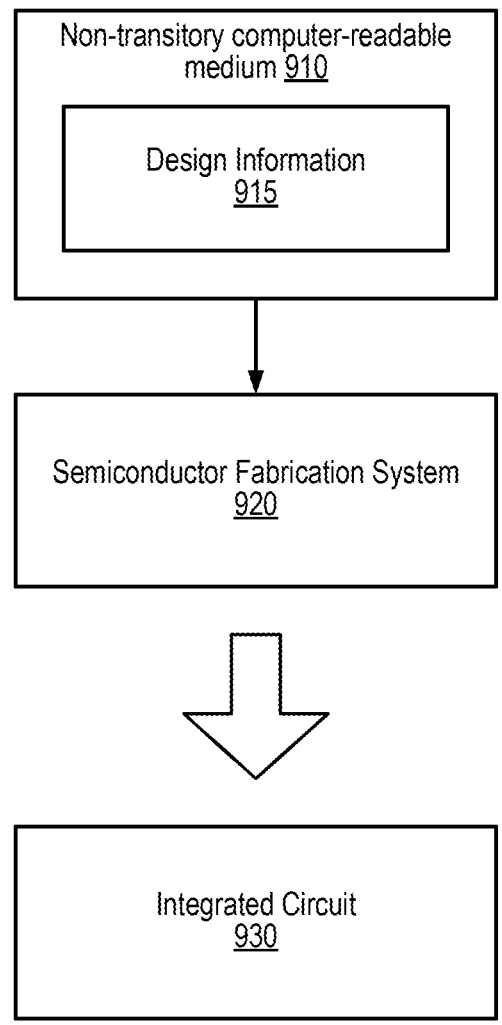
FIG. 9 illustrates a block diagram depicting an example computer-readable medium, according to some embodiments.

FIG. 9 is a block diagram illustrating an example of a non-transitory computer-readable storage medium that stores circuit design information, according to some embodiments. The embodiment of FIG. 9 may be utilized in a process to design and manufacture integrated circuits, such as, for example, an IC that includes computer system 800 of FIG. 8. In the illustrated embodiment, semiconductor fabrication system 920 is configured to process the design information 915 stored on non-transitory computer-readable storage medium 910 and fabricate integrated circuit 930 based on the design information 915.

Non-transitory computer-readable storage medium 910, may comprise any of various appropriate types of memory devices or storage devices. Non-transitory computer-readable storage medium 910 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 910 may include other types of non-transitory memory as well or combinations thereof. Non-transitory computer-readable storage medium 910 may include two or more memory mediums which may reside in different locations, e.g., in different computer systems that are connected over a network.

Design information 915 may be specified using any of various appropriate computer languages, including hardware description languages such as, without limitation: VHDL, Verilog, SystemC, SystemVerilog, RHDL, M, MyHDL, etc. Design information 915 may be usable by semiconductor fabrication system 920 to fabricate at least a portion of integrated circuit 930. The format of design information 915 may be recognized by at least one semiconductor fabrication system, such as semiconductor fabrication system 920, for example. In some embodiments, design information 915 may include a netlist that specifies elements of a cell library, as well as their connectivity. One or more cell libraries used during logic synthesis of circuits included in integrated circuit 930 may also be included in design information 915. Such cell libraries may include information indicative of device or transistor level netlists, mask design data, characterization data, and the like, of cells included in the cell library.

Integrated circuit 930 may, in various embodiments, include one or more custom macrocells, such as memories, analog or mixed-signal circuits, and the like. In such cases, design information 915 may include information related to included macrocells. Such information may include, without limitation, schematics capture database, mask design data, behavioral models, and device or transistor level netlists. As used herein, mask design data may be formatted according to graphic data system (gdsii), or any other suitable format.

Semiconductor fabrication system 920 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 920 may also be configured to perform various testing of fabricated circuits for correct operation.

In various embodiments, integrated circuit 930 is configured to operate according to a circuit design specified by design information 915, which may include performing any of the functionality described herein. For example, integrated circuit 930 may include any of various elements shown or described herein. Further, integrated circuit 930 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
a receiver buffer configured to:
generate, based on an input signal received via a channel, an equalized signal on a signal node; and
disable, in response to an initiation of a training mode, generation of the equalized signal;
a phase compensation circuit coupled to the signal node and configured to, in response to the initiation of the training mode, generate a reference signal on the signal node to replace the equalized signal;
a data sampler circuit coupled to the signal node and configured to sample, based on a data clock signal, the reference signal to generate a plurality of data samples; and
an error sampler circuit coupled to the signal node and configured to sample, based on an error clock signal, the reference signal to generate a plurality of errors samples; and
wherein the phase compensation circuit is further configured to adjust a phase difference between the data clock signal and the error clock signal based on at least some of the plurality of data samples and at least some of the plurality of error samples.

2. The apparatus of claim 1, wherein the phase compensation circuit is further configured to, in response to a number of data samples having been generated, replace the reference signal with a complement reference signal;
wherein the data sampler circuit is further configured to sample, based on the data clock signal, the complement reference signal to generate a plurality of complement data samples; and
wherein the error sampler circuit is further configured to sample, based on the error clock signal, the complement reference signal to generate a plurality of complement errors samples.

3. The apparatus of claim 2, wherein to adjust the phase difference between the data clock signal and the error clock signal, the phase compensation circuit is further configured to adjust the phase difference based on at least some of the plurality of complement data samples and at least some of the plurality of complement error samples.

4. The apparatus of claim 1, wherein to adjust the phase difference between the data clock signal and the error clock signal, the phase compensation circuit is further configured to:
determine a data transition time indicative of when a transition of the reference signal is detected by the data sampler circuit;
determine an error transition time indicative of when the same transition of the reference signal is detected by the error sampler circuit; and
determine the phase difference based on the data transition time and the error transition time.

5. The apparatus of claim 1, further comprising:
a data phase interpolator circuit configured to generate the data clock signal based on a first clock signal and a first delay value; and
an error phase interpolator circuit configured to generate the error clock signal based on a second clock signal and a second delay value.

6. The apparatus of claim 5, wherein the phase compensation circuit is further configured to:
set the first delay value and the second delay value to respective initial values; and
collect an initial one of the plurality of data samples and an initial one of the plurality of error samples.

7. The apparatus of claim 6, wherein the phase compensation circuit is further configured to collect subsequent ones of the plurality of data samples and subsequent ones of the plurality of error samples by incrementing the first and second delay values in response to collecting at least a subsequent one of the plurality of data samples and at least a subsequent one of the plurality of error samples.

8. A method comprising:
based on an input signal received via a channel, generating, by a receiver buffer, an equalized signal on a signal node;
in response to an initiation of a training mode for a receiver system:
disabling, by the receiver buffer, generation of the equalized signal;
generating, by a phase compensation circuit, a reference signal on the signal node to replace the equalized signal;
generating, by a data sampler circuit based on a data clock signal, a plurality of data samples by sampling the reference signal;
generating, by an error sampler circuit based on an error clock signal, a plurality of errors samples by sampling the reference signal; and
adjusting, by the phase compensation circuit, a phase difference between the data clock signal and the error clock signal based on at least some of the plurality of data samples and at least some of the plurality of error samples.

9. The method of claim 8, further comprising replacing the reference signal with a complement reference signal in response to a number of data samples having been generated.

10. The method of claim 9, further comprising:
generating, by the data sampler circuit based on the data clock signal, a plurality of complement data samples by sampling the complement reference signal;
generating, by the error sampler circuit based on the error clock signal, a plurality of complement errors samples by sampling the complement reference signal; and
adjusting, by the phase compensation circuit, the phase difference based on at least some of the plurality of complement data samples and at least some of the plurality of complement error samples.

11. The method of claim 8, wherein adjusting the phase difference between the data clock signal and the error clock signal includes:
identifying two consecutive data samples of the plurality of data samples with different values for the reference signal;
identifying two consecutive error samples of the plurality of error samples with different values for the reference signal; and
determining the phase difference based on the two consecutive data samples and the two consecutive error samples.

12. The method of claim 8, wherein adjusting the phase difference between the data clock signal and the error clock signal includes generating the data clock signal by delaying transitions of a first clock signal using a first delay value.

13. The method of claim 8, wherein adjusting the phase difference between the data clock signal and the error clock signal includes generating the error clock signal by delaying transitions of a second clock signal using a second delay value.

14. The method of claim 8, wherein generating the plurality of data samples and the plurality of error samples includes:
incrementing a first delay value on the data clock signal during the generating of the plurality of data samples; and
incrementing a second delay value on the error clock signal during the generating of the plurality of error samples.

15. A system comprising:
a functional circuit configured to generate a training signal; and
a communication circuit including a plurality of receiver circuits coupled to a data bus, wherein one or more receiver circuits of the plurality of receiver circuits are configured to, in response to an assertion of the training signal:
generate a reference signal on a signal node;
sample the reference signal based on a data clock signal to generate a plurality of data samples;
sample the reference signal, based on an error clock signal, to generate a plurality of errors samples; and
based on at least some of the plurality of data samples and at least some of the plurality of error samples, adjust a phase difference between the data clock signal and the error clock signal; and
wherein, in response to a de-assertion of the training signal, the communication circuit is configured to receive information from the data bus using the data clock signal and the error clock signal.

16. The system of claim 15, wherein the communication circuit is further configured to:
replace the reference signal with a complement reference signal in response to a number of data samples having been generated;
sample the complement reference signal based on the data clock signal to generate a plurality of complement data samples;
sample the complement reference signal, based on the error clock signal, to generate a plurality of complement errors samples; and
modify the phase difference based on at least some of the plurality of complement data samples and at least some of the plurality of complement error samples.

17. The system of claim 15, wherein to adjust the phase difference between the data clock signal and the error clock signal, the communication circuit is further configured to:
determine a data transition time indicative of when a change in values of the plurality of data samples occurs;
determine an error transition time indicative of when a change in values of the plurality of error samples occurs; and
determine the phase difference based on the data transition time and the error transition time.

18. The system of claim 15, wherein the communication circuit further includes: a first delay circuit configured to generate the data clock signal based on a first clock signal and a first delay value; and
a second delay circuit configured to generate the error clock signal based on a second clock signal and a second delay value.

19. The system of claim 18, wherein the communication circuit is further configured to:
set the first delay value and the second delay value to respective initial values;

collect an initial one of the plurality of data samples and an initial one of the plurality of error samples using the respective initial values; and collect subsequent ones of the plurality of data samples and subsequent ones of the plurality of error samples while incrementing the first and second delay values.

20. The system of claim 15, wherein the reference signal, the data clock signal, and the error clock signal are generated from a same clock signal source.

\* \* \* \* \*